United States Patent [19]

Bianchi

[11] Patent Number: 5,021,084

[45] Date of Patent: Jun. 4, 1991

[54] PROCESS FOR IMPROVING HIGH-TEMPERATURE ALLOYS

[76] Inventor: Leonard M. Bianchi, 5330 Taylor Mill Rd., Taylor Mill, Ky. 41015

[21] Appl. No.: 17,794

[22] Filed: Feb. 24, 1987

[51] Int. Cl.$^5$ ............................................. C21G 11/10
[52] U.S. Cl. .................................. 75/10.13; 75/10.14;
75/10.15; 75/10.18; 75/10.19; 75/10.21;
75/10.22; 75/10.25; 75/10.26; 75/10.61;
118/726; 219/121.17; 219/121.38; 219/121.66;
427/50
[58] Field of Search ........................... 75/10.13–10.15,
75/10.18–10.19, 10.21, 10.22, 10.29, 65 EB,
10.25, 10.26; 427/50; 219/121 EE; 118/726;
148/174

[56] References Cited

U.S. PATENT DOCUMENTS

| | | | |
|---|---|---|---|
| 3,607,222 | 9/1971 | Kennedy | 75/10.29 |
| 4,190,404 | 2/1980 | Drs et al. | 75/65 EB |
| 4,518,418 | 5/1985 | Fletcher et al. | 75/10.29 |

Primary Examiner—Stephen J. Lechert, Jr.
Attorney, Agent, or Firm—Walter Unterberg

[57] ABSTRACT

This invention is the electron beam evaporation and deposition(EBED) process which produces high purity and ultrafine grain size in high-temperature and reactive metal alloys. These properties are important in metals used in aircraft gas turbine components operating under high-cycle fatigue conditions at up to 1250° C. Ingots produced by current melting, remelting and refining methods whose properties are to be improved are placed in a vacuum chamber and evaporated by an electron beam. The resulting vapor is condensed on a starting pad to form the product ingot with the desired improved properties. The desired shape and size of the product ingot is achieved by controlling the motion of the movable rod on which the starting pad is placed. Proven increases in fatigue life have been obtained with an alloy of chromium, cobalt and molybdenum by use of the EBED process. It should also produce similar results in alloys with other base metal elements such as iron, nickel, titanium, zirconium, aluminum or magnesium.

7 Claims, 1 Drawing Sheet

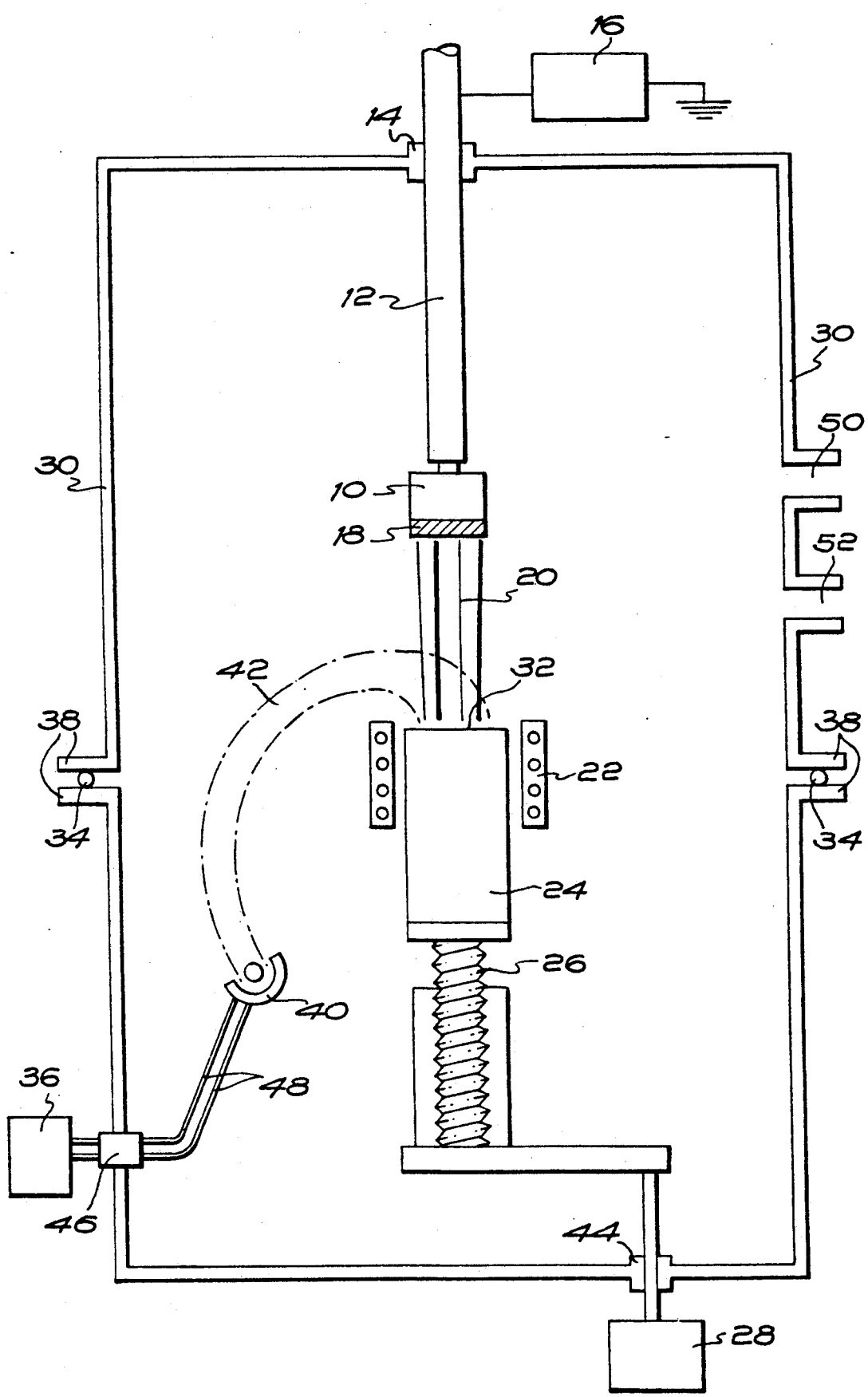

PROCESS FOR IMPROVING HIGH-TEMPERATURE ALLOYS

BACKGROUND OF THE INVENTION

1. Field of the Invention

This invention relates to a process for improving high-temperature alloys, and more specifically, to the electron beam evaporation and deposition process which produces high purity and ultrafine grain size in high-temperature and reactive metal alloys.

2. Prior Art

Alloys made of high melting-point nickel, cobalt and iron base metals are used in aircraft gas turbines for blades, vanes and disks which operate under high-cycle fatigue conditions at metal temperatures up to 1250° C. For these gas turbine components to have long service life and low maintenance, the most important material property is high purity, i.e., the smallest possible size and number of nonmetallic inclusions, where cracks can start with resulting shortened service life under the prevailing high-cycle fatigue operating conditions. The next most important property for such alloys is ultrafine grain size which gives the alloys superplasticity and increased formability, such as ease in forging. It is desirable for high-temperature alloys to possess both high purity and ultrafine grain size.

Various processes of the melting and remelting (or refining) type have been devised for producing high-temperature alloys of high purity, and the principal ones are briefly characterized below:

Vacuum Arc Remelting (VAR) uses a molten pool with heat extraction from the bottom of the pool, resulting in directional solidification. Vacuum Arc Double Electrode Remelting (VADAR) employs two consumable electrodes with their ends facing each other, which approach each other during melting so that the molten metal droplets fall into a mold beneath the electrodes. Electroslag Remelting (ESR) is a process where a consumable electrode is remelted under a slag that provides resistance heating.

Vacuum Induction Melting (VIM) permits particles to spend a greater amount of time in the molten metal pool, but is open to reactions between the melt and the refractory crucible. Induction Slag Melting (ISM) uses a "crucible" consisting of a thin frozen shell formed on the inside walls of a copper tube, with side feeding to the melts. Electron Beam Melting (EBM) allows a variety of feed materials to be used (including sponge, scrap and chips) and does vaporize unwanted gases and volatile trace elements.

Plasma Melting (PM) has many advantages, such as a high degree of control of the plasma (temperature, atmosphere, flow rate), and can use lower grade starting materials. Electron Beam Cold Hearth Refining (EBCHR) uses an electron beam to melt but not vaporize an electrode or feed which falls into a cold mold with the aim of achieving smaller grain sizes in the ingot produced. Laser Beam Melting (LBM) has been used in laboratories to produce high temperature alloys.

Current practice is to start with a VIM ingot, and then use one or two of the above-named processes in series. The second steps are VAR, VADAR, PC, ESR or EBCHR. A three-step process uses ESR followed by VAR.

Of these processes, the ones producing smaller inclusions which significantly increase the fatigue life are: VIM/VAR, VIM/ESR and VIM/EBCHR. The quantitative purity, in terms of largest inclusion diameter, and the associated fatigue life obtained with the last-named three two-step processes are shown for a nickel base alloy containing chromium, cobalt, molybdenum and other additions, known as Rene 95 in the following table:

| Process | Largest inclusion diameter, micron meters | Cycles to fatigue failure |
| --- | --- | --- |
| VIM/VAR | 25 | 20 |
| VIM/ESR | 11 | 100 |
| VIM/EBCHR | 8 | 200 |

While these process developments have resulted in a reduction of inclusion size and extention of fatigue life, further improvements are needed. A case in point is high-temperature alloys of titanium used in rotating parts of jet engines. These alloys have been routinely triple melted, and yet the occurrence of so-called hard alpha Type 1 areas, which are high in concentration of the undesirable elements carbon, nitrogen or oxygen which lead to failure at lower stresses than in alloys without such areas, could not be avoided and are believed to have caused at least six jet engine failures. Currently, some of the melting processes mentioned above, such as VAR, EBM, and EBCHR, are being tried to reduce Type 1 areas, but unsuccessfully to date.

The melting and remelting processes have attained some success in achieving high purity and longer fatigue life, but have not produced adequate ultrafine grain sizes. Toward this end powder compaction (PC) has been used, wherein the alloy is made in powder form and the consolidated into an ingot or disk. Control of the powder grain size permits an ultrafine grain structure to be obtained.

The present state of art of high temperature alloy processing has produced ultrafine grain structure by using the powder metallurgy approach. By producing powders of these alloys by processes that rapidly solidify the metal into very small particles, ultrafine grain sizes have been realized. The alloys have superplastic properties and are formed into final products with much less difficulty than conventional larger grained materials. However, none of the powder metallurgy processes attain the high purity of the melting processes and the associated increased fatigue life.

Thus, it is seen that there is a need for a process which will provide a high-temperature alloy exhibiting high purity and ultrafine grain structure.

SUMMARY OF THE INVENTION

Accordingly, it is the primary object of this invention to provide a process which can produce high-temperature alloy ingots possessing the smallest sizes of inclusions for long high-cycle fatigue life, the least hard alpha areas for greater strength, and ultrafine grain size for superplastic deformation.

It is also an object of the present invention to provide a process which can produce nickel-cobalt-iron base high-temperature alloy ingots possessing the smallest sizes of inclusions for longer high-cycle fatigue life.

It is another object of this invention to provide a process which can produce titanium base high-temperature alloys possessing smaller hard alpha areas for greater strength parts.

It is another object of this invention to provide high-temperature alloys of any base element with ultrafine grain size so that they are superplastic for ease of deformation.

It is a further object of this invention to provide an economical process for the production of specialty shaped ingots (such as discs) of high-temperature alloys.

To accomplish these objects, the present invention is a process consisting of electron beam evaporation and deposition (EBED) which is applied as a final process step following any other steps. Briefly, EBED consists of placing the source ingot whose purity and/or structure is to be improved into a conventional vapor deposition chamber evacuated to a pressure of less than about half a millitorr. After the electron beam source has been properly aimed at the exposed face of the source ingot and an inert gas (in one embodiment) has been admitted into the chamber, evaporation of the source ingot begins. A movable starting pad is advanced toward the evaporating source ingot and serves as the surface on which the source ingot vapor condenses and deposits. The starting pad is continually moved so as to control the distance through which the evaporated material travels to be condensed.

The condensed material is collected until the desired length of deposit, or product ingot, is obtained. After the chamber cools down, it is opened and the starting pad with the product ingot is removed from the chamber. Then the product ingot is cut from the starting pad.

BRIEF DESCRIPTION OF THE FIGURE

The single FIGURE of the drawing is a schematic elevation, partially in section, of a vacuum chamber containing an electron beam evaporation and deposition apparatus useful for carrying out the process of this invention, and incorporating the preferred embodiment of the apparatus.

DESCRIPTION OF THE PREFERRED EMBODIMENT

The chamber 30 contains an electron beam source 40 which directs a beam 42 toward the ingot vapor source 24 so as to heat and evaporate the material comprising source 24. The vapor 20 generated from source 24 is caused to travel to starting pad 10 where it condenses and deposits to form the improved product ingot 18. This process will now be described in greater depth and detail, starting with the apparatus.

Chamber 30 is of such a construction that it can accommodate a high vacuum, and can be opened at flanges 38 to admit various pieces of equipment, after which chamber 30 is closed by bringing flanges 38 together against sealing gaskets 34 to make a vacuum-tight joint. The walls of chamber 30 are penetrated at five other locations. First, rotating seal 44 permits the output shaft of electric motor 28 to acuate the source ingot feed mechanism 26 attached to crucible 22 in which is placed the source ingot 24, with its exposed outer surface 32.

Second, static seal 46 accommodates the penetration of electrical leads 48 from the electron beam power supply 36 to connect to electron beam source 40, which generates electron beam 42 which is directed toward surface 32 of source ingot 24 to produce ingot vapor 20 by irradiation of surface 32 of source ingot 24.

Third, sliding-rotating seal 14 accommodates movable rod 12 which actuates attached starting pad 10 in rotation or translation, as desired, to provide a suitable distance between the product ingot 18 which is growing on starting pad 10, and the receding surface 32 of source ingot 24, during simultaneous evaporation of source ingot 24 into ingot vapor 20, and the condensation of ingot vapor 20 as a deposited product ingot 18 on starting pad 10. A D.C. power supply 16 is connected to rod 12 and can be used to apply a fixed or variable electron potential between source ingot 24 and starting pad 10 with product ingot 18.

Fourth, vacuum port 52 connects the chamber 30 to a vacuum pump which evacuates chamber 30 to a desired vacuum. Fifth, gas inlet port 50 acts as a duct through which any desired inert gas or gases can be admitted to chamber 30 in any desired amount.

Typical Operating Sequence

First, the chamber 30 is opened and source ingot 24 and starting pad 10 are placed in chamber 30, which is then closed and evacuated to a pressure of less that about 0.5 millitorr, using vacuum port 52 and the vacuum pump connected to port 52. Next, electron beam source 40 is energized by its power supply 36 to generate the electron beam 42 which is aimed at and heats the surface 32 of the source ingot 24 to produce vapor 20. An inert gast, such as argon or helium, can be bled into the chamber 30 through the gas inlet port 50, and a controlled vacuum level maintained in the chamber.

When the evaporation operates as desired, starting pad 10 is moved into position in the vicinity of evaporating surface 32 to initiate deposition of vapor 20 on starting pad 10 to form product ingot 18. Movable rod 12 can be used to rotate and/or change the orientation of the product ingot 18 during the buildup period in order to obtain the desired shape or size. When build up is complete, the electron beam 42 is turned off at power supply 36 and the pressure in chamber 30 is allowed to rise to the atmospheric value by stopping the vacuum pump. It is normal practice to wait until the hot parts have cooled down substantially before opening chamber 30 and removing starting pad 10 with product ingot 18. Lastly, product ingot 18 is separated from starting pad 10.

Results of Process

The EBED process constituting the present invention was applied to the production of several high-temperature alloys, with the result in all cases that purity was improved or the grain size made finer, or both. Three different alloys will be mentioned here.

The alloy of nickel, chromium, cobalt and molybdenum known as Rene 95 was available in a source ingot made by the VIM process. This source ingot contained oxides, nitrides and carbides, with inclusions exceeding 100 micrometers It is postulated that in the course of the evaporation portion of the EBED process the vacuum and high temperature cause the chemical breakdown of the nitrides, oxides and carbides, and other inclusions, while the source ingot material is in the vapor state. Some of these compounds are removed by the vacuum system, so that the condensate constituting the product ingot is lower in inclusions and their constituent elements. The product ingot prepared by the EBED process in fact showed much smaller inclusions, with a maximum size of less than 2 micrometers, and an associated high-cycle fatigue life of 1000. The table shown in the Prior Art section of this specification for Rene 95 may now be enlarged with the addition of the present result:

| Process | Largest Inclusion diameter, micron meters | Cycles to fatigue failure |
| --- | --- | --- |
| VIM/VAR | 25 | 20 |
| VIM/ESR | 11 | 100 |
| VIM/EBCHR | 8 | 200 |
| VIM/EBED | 2 | 1000 |

It is seen that the EBED process greatly reduces the inclusions and extends the fatigue life.

Those skilled in the art will recognize that the composition of the first material to condense will not be the same as the composition of the ingot. However, the state of art of personnel skilled in this art will allow them to use pre "salted" starting pads and to wait a sufficient time for the condensate chemistry to match the ingot chemistry. In production it takes personnel skilled in the art only a matter of 5 to 10 minutes to achieve such a condition.

The second application of the EBED process was to improve a VAR-melted source ingot of a titanium alloy with 4% vanadium and 6% aluminum. The source ingot contained hard alpha Type 1 areas of titanium nitride. While the source ingot is in the molten and vapor states, such elements as nitrogen are scattered, resulting in lower maximum concentrations of these elements in the product ingot. Examination of the product ingot showed that the Type 1 areas had disappeared.

Those skilled in the art will recognize that evaporation and condensation of titanium alloys containing highly volatile elements such as vanadium and aluminum can result in a condensate of a different composition of the volatile elements compared to the source ingot. However, those skilled in the art will adjust the pressure and other variables so as to obtain the alloy desired which can be the alloy contained in the source ingot.

The third application of the EBED process was to a high-temperature cobalt base alloy containing cobalt, chromium, aluminum, yttrium and 3% hafnium. The starting pad was kept at a low temperature of about 800° F., and the product ingot was in the form of a disk approximately 6 inches diameter by 3 inches thick. After cooling, the disk was cut from the starting pad, sectioned, and studied metallographically. It was found to have a grain size of less than 10 micrometers and to be superplastic at moderate temperatures. Thus the EBED process produced an improved purity alloy ingot that can be easily formed to its final shape.

Although the invention has been shown and described with respect to preferred embodiments and application to certain high-temperature alloys, it should be evident to those skilled in the art that it is applicable to a wide variety of high-temperature alloys having iron, nickel, cobalt, titanium, zirconium, aluminum or magnesium as the base metal element, and that various changes may be made therein without departing from the spirit and scope of the invention.

What is claimed is:

1. A process for decreasing the size of nonmetallic inclusions, increasing the fineness of grain structure and increasing the purity in high-temperature metal alloys having iron, nickel, cobalt, titanium, zirconium, aluminum or magnesium as the base metal element comprising the ordered steps of producing a source ingot comprising a high-temperature alloy whose base metal is selected from the group consisting of iron, nickel, cobalt, titanium, zirconium, aluminum and magnesium by a method selected from the group consisting of vacuum arc remelting, vacuum arc double electrode remelting, electroslag remelting, vacuum induction melting, electron beam cold hearth refining, plasma melting, induction slag melting, laser beam melting and electron beam melting, or combinations of two of the methods from this group;

placing said source ingot in a chamber;

placing an electron beam source in said chamber;

placing a starting pad on a movable rod in said chamber;

evacuating said chamber to a pressure of less than about 0.5 millitorr;

energizing said electron beam source to generate an electron beam aimed at a surface of said source ingot to cause said source ingot to evaporate from said surface, forming a vapor;

moving said starting pad near said surface to initiate deposition of said vapor on said starting pad to form the product ingot;

controlling the motion of said movable rod to rotate and change the orientation of said forming product ingot during deposition to obtain the desired shape and size of said product ingot;

turning off said electron beam after completion of the product ingot;

raising the chamber pressure to atmospheric;

removing the starting pad and product ingot from the chamber; and separating the product ingot from the starting pad.

2. The process of claim 1 including introducing an inert gas into the chamber.

3. The process of claim 1 including applying an electron potential between source ingot and starting pad.

4. The process of claim 2 including applying an electron potential between source ingot and starting pad.

5. The process of claim 1 wherein the high-temperature alloy is an alloy of nickel, cobalt and iron, known as Rene 95.

6. The process of claim 1 wherein the high-temperature alloy is a titanium alloy including vanadium and aluminum.

7. The process of claim 1 wherein the high-temperature alloy is a cobalt-chromium-aluminum-yttrium alloy with 3% hafnium.

* * * * *